(12) United States Patent
Kang et al.

(10) Patent No.: US 7,786,020 B1
(45) Date of Patent: Aug. 31, 2010

(54) METHOD FOR FABRICATING NONVOLATILE MEMORY DEVICE

(75) Inventors: Hye-Ran Kang, Gyeonggi-do (KR); Sung-Yoon Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/647,052

(22) Filed: Dec. 24, 2009

(30) Foreign Application Priority Data

Jul. 30, 2009 (KR) .................. 10-2009-0070050
Nov. 30, 2009 (KR) .................. 10-2009-0117425

(51) Int. Cl.
*H01L 21/302* (2006.01)

(52) U.S. Cl. .................. 438/734; 438/39; 438/115; 438/128; 257/E21.026; 257/E21.259; 257/E21.613

(58) Field of Classification Search .................. 438/42, 438/343; 257/E21.492, E21.613
See application file for complete search history.

(56) References Cited

U.S. PATENT DOCUMENTS 6,372,651 B1 * 4/2002 Yang et al. .................. 438/706
7,442,606 B2 * 10/2008 Lee .................. 438/257

* cited by examiner

*Primary Examiner*—Charles D Garber
*Assistant Examiner*—Cheung Lee
(74) *Attorney, Agent, or Firm*—IP & T Law Firm PLC

(57) ABSTRACT

A method for fabricating a nonvolatile memory device includes repeatedly stacking a stacked structure over a substrate to form a multi-stacked structure, wherein the stacked structure includes a conductive layer and an insulation layer, forming a photoresist pattern over the multi-stacked structure, first-etching an uppermost stacked structure of the multi-stacked structure using the photoresist pattern as an etch barrier, second-etching a resultant structure formed by the first-etching through the use of a breakthrough etching, slimming the photoresist pattern to form a slimmed photoresist pattern, and third-etching the uppermost stacked structure using the slimmed photoresist pattern as an etch barrier and, at the same time, etching a stacked structure disposed under the uppermost stacked structure and exposed by the first-etching.

20 Claims, 15 Drawing Sheets

METHOD FOR FABRICATING NONVOLATILE MEMORY DEVICE

CROSS-REFERENCES TO RELATED APPLICATIONS

The present application claims priority of Korean Patent Application Nos. 10-2009-0070050 and 10-2009-0117425, filed on Jul. 30, 2009, and Nov. 30, 2009, respectively, which are incorporated herein by reference in their entirety.

BACKGROUND OF THE INVENTION

Exemplary embodiments of the present invention relate to a method for fabricating a semiconductor device, and more particularly, to a method for fabricating a nonvolatile memory device using in-situ photoresist slimming.

To increase the device density when a design rule decreases, a flash memory device employs a method of using a three-dimensional (3D) structure instead of an existing floating gate.

Meanwhile, a photolithography process used to fabricate a semiconductor device, such as a flash memory device, necessarily requires a photo-mask to form a pattern. This photo-mask is formed to selectively allow light to pass according to patterns of various shapes using a light blocking material on the surface of a light-transmitting substrate, wherein the patterns correspond to integrated circuits to be formed.

Thus, desired patterns are exactly transcribed on the photoresist when performing the alignment exposure in the photolithography process. However, this method for forming the mask has a disadvantage in that a desired line width is not sufficiently obtained because of the interference between patterns formed on the photo-mask. As a line width of a circuit of the semiconductor device becomes narrower, and thus, as a wavelength of a light source for the exposure is shortened, it becomes more difficult to obtain a desired line width of the photo-mask.

That is, a pattern in a line shape whose line width is relatively fine is affected by the density of patterns around it. Therefore, although a pattern is formed on the mask to have a normal line width, the size of the pattern is changed by the diffraction of light when forming the pattern on the photoresist through the exposure step in a photolithography process. Especially, in the case that a light proximity effect of a mask pattern is not considered properly, the line width of the pattern is distorted contrary to the original intent of the exposure in the lithography process. Thus the linearity of the line width is distorted, resulting in a negative influence on properties of the semiconductor device.

As illustrated in FIG. 1, in the prior art, the slimming of the photoresist was not properly achieved when performing a slimming etching process after a mask process. As a result, it was difficult to form a pattern in a step shape, and the line edge roughness (LER) was generated.

Namely, in case a pattern is formed by a method for forming a fine pattern using an existing lithography process, the LER A illustrated in FIG. 1 is formed by a mask error occurring in the mask drawing and a structure of the resist.

The generation of the LER A affects subsequent processes, such as an etching process, and, negatively influences electrical properties, especially a threshold voltage, of the semiconductor device, as shown in FIG. 2. Therefore, lots of research and development of processes are in progress to minimize the generation of the LER when forming a pattern.

The typical LER is usually generated in the resist of a chemical amplifying type applied to KrF, ArF, 157 nm, EUV, or E-beam. That is, the LER is mainly generated by a chemical reaction between matrix resin and the resist, and the non-uniform diffusion of the acid generated in the exposure, and also caused by a non-uniform developing mechanism with a developer that is used.

Furthermore, the LER may be generated by performing a patterning process using a mask. Because the selection of a mask material and a light source on a mask fabricated to form a pattern whose size is getting smaller, the LER may be transcribed on a pattern when performing a patterning process using the mask. Therefore, the selection of a photoacid generator applied to induce the uniform diffusion of the acid is important when using the chemical amplifying type resist. Also, it may be required to process and apply an acid capable of controlling the influence for the exposure and the post exposure baking.

However, the LER is inevitably generated in a process of applying the chemical amplifying type resist in spite of lots of research and improvement of the processing requirement. Therefore, a current concern is how much the LER can be minimized using a subsequent process. The generation of the LER when forming the fine pattern causes a big concern to the properties of the semiconductor device, and thus, it is difficult to expect the stabilization of the process.

SUMMARY OF THE INVENTION

Exemplary embodiments of the present invention are directed to a method for fabricating a nonvolatile memory device capable of minimizing LER generation by forming a pattern having a multi-step structure, wherein the pattern is formed by repeatedly performing in-situ photoresist slimming and etching in an etch chamber when performing an etching process for forming the pattern.

In accordance with an embodiment of the present invention, a method for fabricating a nonvolatile memory device includes repeatedly stacking a stacked structure over a substrate to form a multi-stacked structure, wherein the stacked structure includes a conductive layer and an insulation layer, forming a photoresist pattern over the multi-stacked structure, first-etching an uppermost stacked structure of the multi-stacked structure using the photoresist pattern as an etch barrier, second-etching a resultant structure formed by the first-etching through the use of a breakthrough etching, slimming the photoresist pattern to form a slimmed photoresist pattern, and third-etching the uppermost stacked structure using the slimmed photoresist pattern as an etch barrier and, at the same time, etching a stacked structure disposed under the uppermost stacked structure and exposed by the first-etching.

The multi-stacked structure may include at least two of the stacked structures. The multi-stacked structure may be formed to have a step shape by the first-etching, the second-etching, the slimming, and the third-etching. The second-etching, the slimming, and the third-etching may be performed as one unit cycle, which is repeated until the substrate is exposed. The multi-stacked structure may be formed to have a step structure having 8 steps.

The first-etching and the third-etching may include etching the insulation layer, and etching the conductive layer. The insulation layer may include an oxide layer, and the conductive layer may include polysilicon. The etching of the insulation layer may use a single or mixed gas including one or more selected from the group consisting of $CF_4$, $CHF_3$ and $CH_2F_2$ as an etch gas, and may use a He gas or an Ar gas as an insert gas. The etching of the conductive layer may use a single gas selected from the group consisting of HBr, Cl$_2$ and O$_2$, or a mixed gas of HBr and Cl$_2$ as an etch gas.

The breakthrough etching may use a CF$_4$ gas or an O$_2$ gas. The CF$_4$ gas may be supplied at a flow rate of approximately 30 sccm to approximately 150 sccm, and the O$_2$ gas may be provided at a flow rate of approximately 5 sccm to approximately 200 sccm. The breakthrough etching may be performed using a bias power in a range of approximately 0 V to approximately 50 V.

The photoresist pattern may use an I-Line exposure source. The slimming of the photoresist pattern may be performed at a pressure of approximately 20 mTorr to approximately 100 mTorr and with a source power of approximately 1,000 W to approximately 1,800 W. The slimming of the photoresist pattern may be performed using a mixed gas of He and O$_2$, or a mixed gas of He, O$_2$ and N$_2$, and inserting a CF$_4$ gas to the mixed gas. The CF$_4$ gas may be supplied at a flow rate that is in a range of approximately 3% to approximately 10% of a flow rate of the mixed gas.

In accordance with another embodiment of the present invention, a method for fabricating a nonvolatile memory device includes repeatedly stacking a stacked structure over a substrate to form a multi-stacked structure, wherein the stacked structure includes a conductive layer and an insulation layer, forming a photoresist pattern over the multi-stacked structure, first-etching an uppermost stacked structure of the multi-stacked structure using the photoresist pattern as an etch barrier, second-etching a resultant structure formed by the first-etching through the use of a breakthrough etching, forming a polymer layer over the photoresist pattern on which the polymer layer is formed, slimming the photoresist pattern, and third-etching the uppermost stacked structure using the slimed photoresist pattern as an etch barrier and, at the same time, etching a stacked structure disposed under the uppermost stacked structure and exposed by the first-etching.

The multi-stacked structure may include at least two of the stacked structures. The multi-stacked structure may be formed to have a step shape by the first-etching, the second-etching, the forming of the polymer layer, the slimming, and the third-etching. The second-etching, the forming of the polymer layer, the slimming, and the third-etching may be performed as one unit cycle, which is repeated until the substrate is exposed. The multi-stacked structure may be formed to have a step structure having 8 steps.

The forming of the polymer layer may use a CH series gas that includes one selected from the group consisting of CH$_4$, CH$_2$F$_2$, C$_2$H$_2$, and C$_2$H$_4$. The forming of the polymer layer may be performed by supplying a bias power in a range of approximately 200 W to approximately 400 W without supplying a source power.

DESCRIPTION OF SPECIFIC EMBODIMENTS

Figure 1:
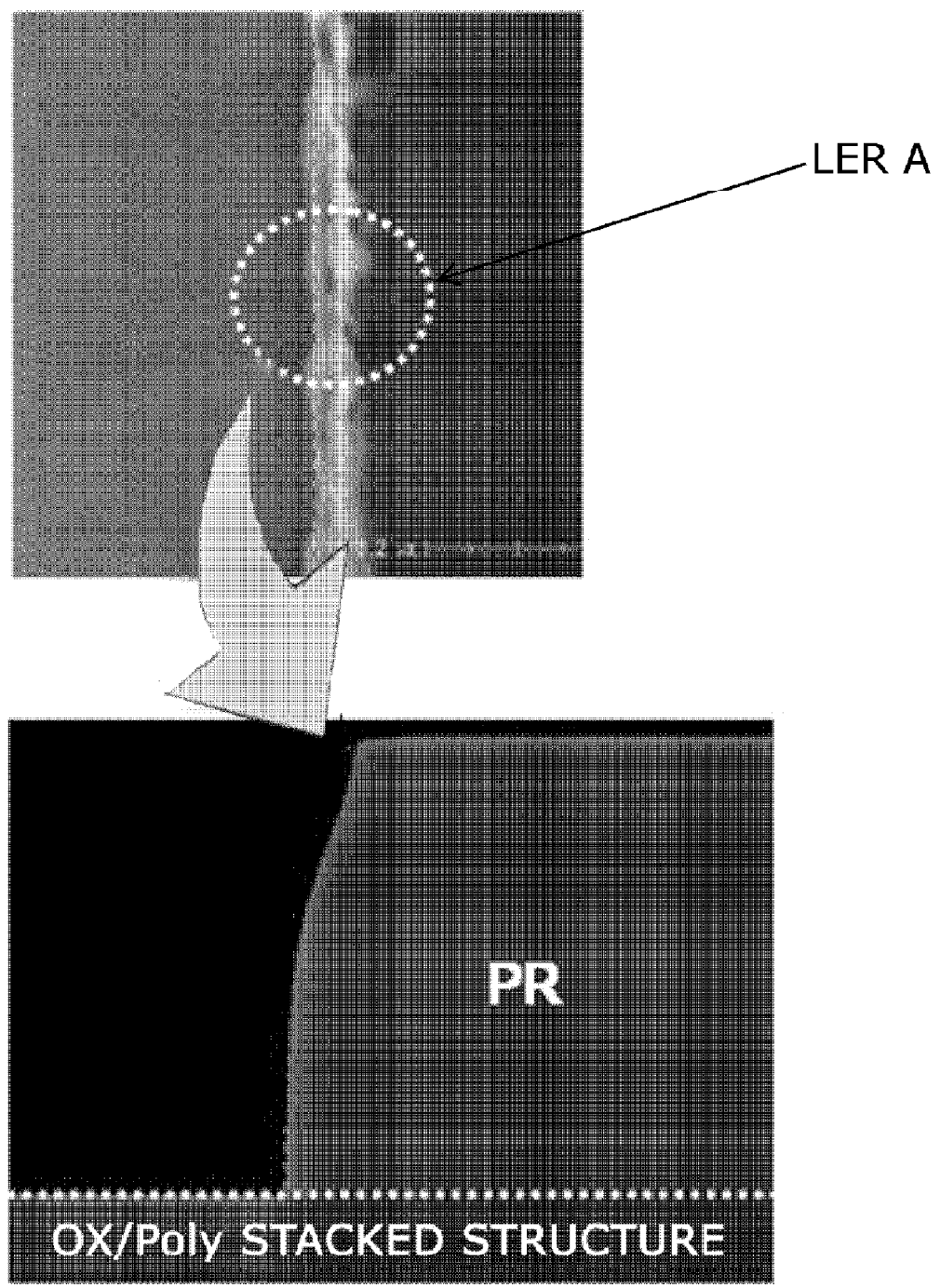
FIG. 1 is an image representing a portion where LER is measured in a conventional method for fabricating a photomask.
Figure 2:
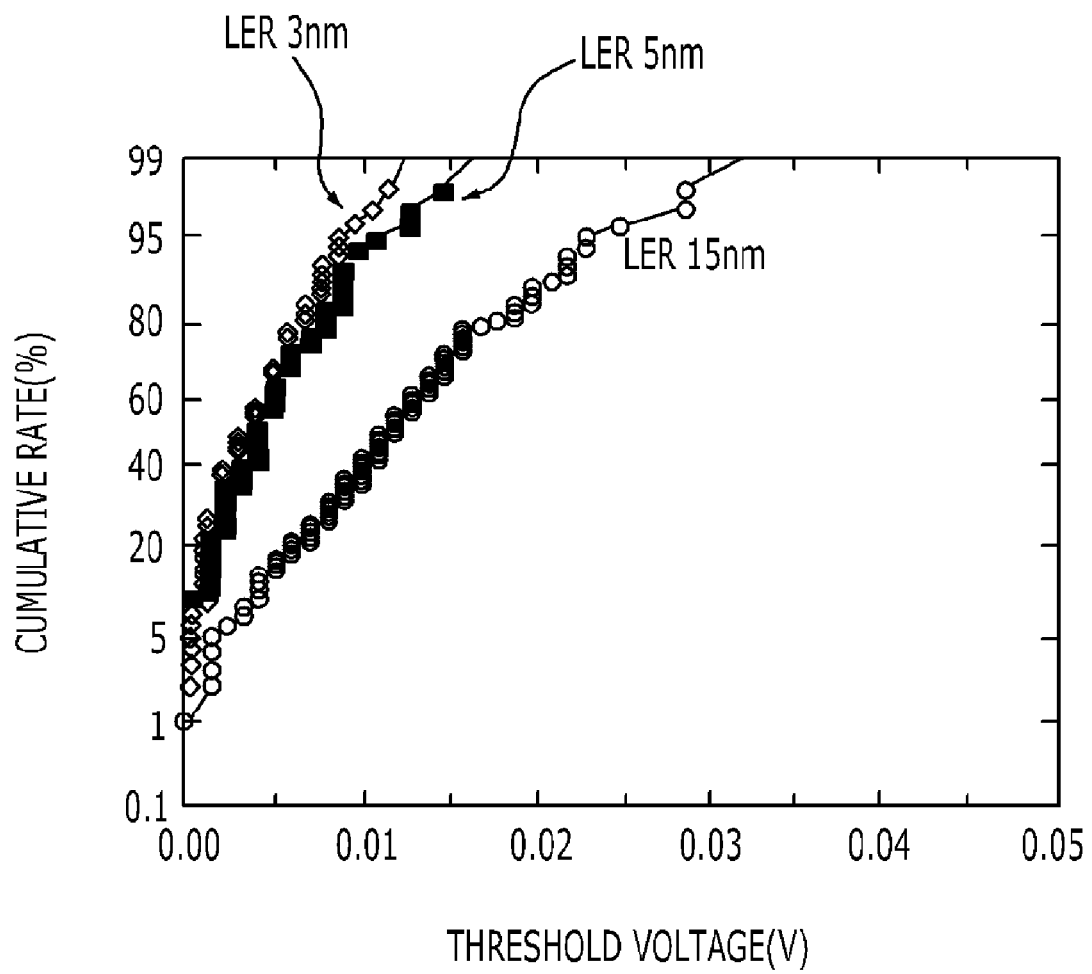
FIG. 2 is a graph representing the influence exerted on a threshold voltage property of a semiconductor device in cases where the LER is serious and not serious.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Each embodiment of the present invention provides a method for forming a pattern of a step structure for the cell string connection in a three-dimensional (3D) structure of a NAND flash memory device.

The present invention can form a step structure having several steps (i.e., a multi-step structure) by repeatedly performing the in-situ photoresist slimming and etching in an etch chamber after performing a mask process once, without performing the mask process several times when forming a pattern in a step shape.

FIGS. 3A to 3G illustrate a method for fabricating a nonvolatile memory device in accordance with a first embodiment of the present invention.

Figure 3A:
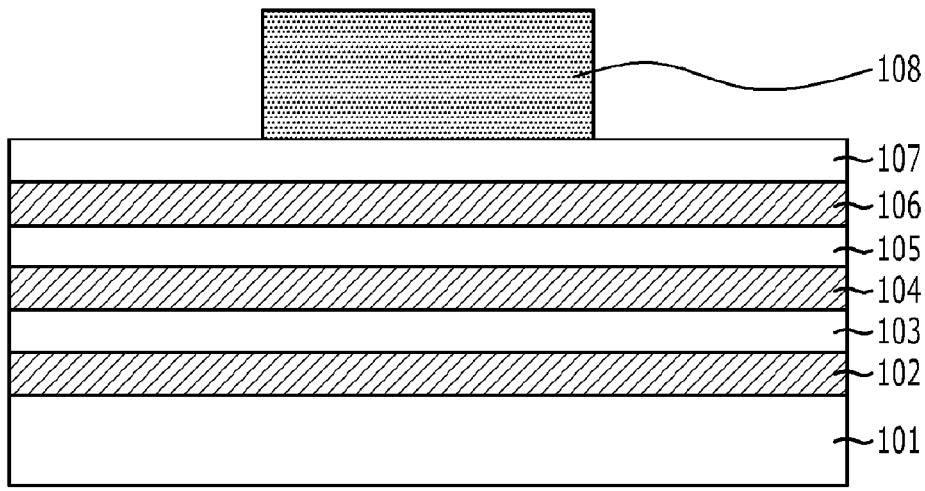
FIGS. 3A to 3G illustrate a method for fabricating a nonvolatile memory device in accordance with a first embodiment of the present invention.

Referring to FIG. 3A, a first conductive layer 102 is formed on a silicon substrate 101, and a first insulation layer 103 is formed on the first conductive layer 102. The first conductive layer 102 is to form a memory cell, and thus, may be formed with polysilicon. The first insulation layer 103 is for the inter-layer insulation of each memory cell, and thus, may be formed of an oxide layer.

After that, a second conductive layer 104 and a second insulation layer 105 are sequentially formed on the first insulation layer 103. A third conductive layer 106 is formed on the second insulation layer 105, and a third insulation layer 107 is formed on the third conductive layer 106.

For simplifying the below explanation, it is assumed that the stacked structure is formed by repeatedly stacking a conductive layer and an insulation layer 3 times, but the present invention is not limited thereto. Although it is not shown, the stacked structure may be formed by repeatedly stacking the conductive layer and the insulation layer 4 or more times. Preferably, the stacked structure is formed by repeatedly stacking the conductive layer and the insulation layer 8 or more times.

Subsequently, a photoresist pattern 108 defining a pattern region is formed on the third insulation layer 107. The photoresist pattern 108 is formed by coating photoresist on the third insulation layer 107 and patterning the coated photoresist to define the pattern region through exposure and development processes. Herein, the photoresist is preferably formed to become the photoresist pattern 108 using an I-Line exposure source. A thickness of the photoresist pattern 108 may be at least 20,000 Å, as a result of considering a processing margin of slimming etching and multi-stack etching processes performed on the stacked structure of the conductive layers and the insulation layers. Preferably, the thickness of the photoresist pattern 108 is in a range of 20,000 Å to 25,000 Å. In case of stacking the conductive layers and the insulation layers 8 or more times, the thickness of the photoresist pattern 108 may be at least 45,000 Å.

Figure 3B:
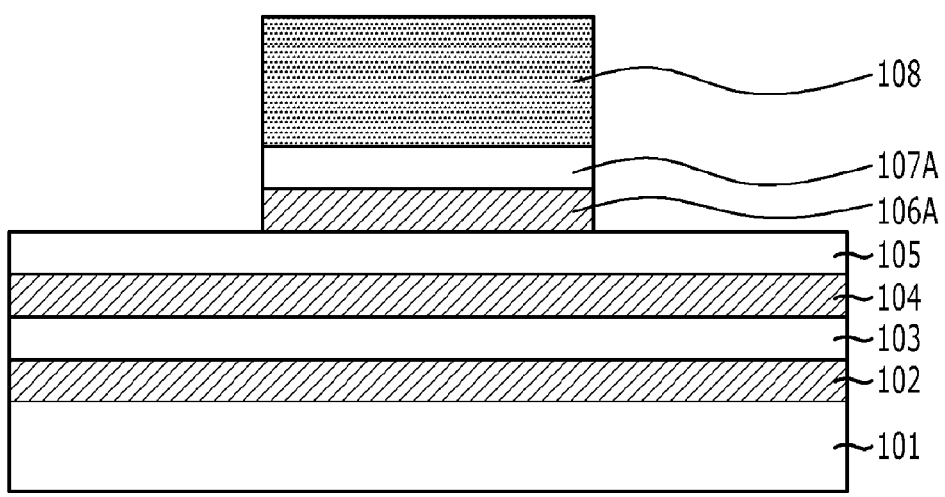

Referring to FIG. 3B, the third insulation layer 107 and the third conductive layer 106 are selectively etched using the photoresist pattern 108 as an etch barrier.

Herein, it is preferable to etch the third insulation layer 107 and the third conductive layer 106 with different etch gases since the third insulation layer 107 and the third conductive layer 106 have different etch rates.

In case the third insulation layer 107 is formed of the oxide layer, it is preferable to etch the third insulation layer 107 with an oxide etch gas. The oxide etch gas may include a single gas or a mixed gas selected from the group consisting of $CF_4$, $CHF_3$ and $CH_2F_2$. Furthermore, a helium (He) gas or an argon (Ar) gas may be used as an insert gas.

In case the third conductive layer 106 is formed of polysilicon, it is preferable to etch the third conductive layer 106 with a silicon etch gas. The silicon etch gas may include a single gas selected from the group consisting of HBr, $Cl_2$ and $O_2$, or a mixed gas of HBr and $Cl_2$.

The third conductive layer 106 is selectively etched without the loss of the second insulation layer 105 by etching the third insulation layer 107 and the third conductive layer 106 with different etch gases, as a result of considering the etch selectivity of each of the third insulation layer 107 and the third conductive layer 106. As a result, a first etched third insulation layer 107A and a first etched third conductive layer 106A are obtained.

Figure 3C:
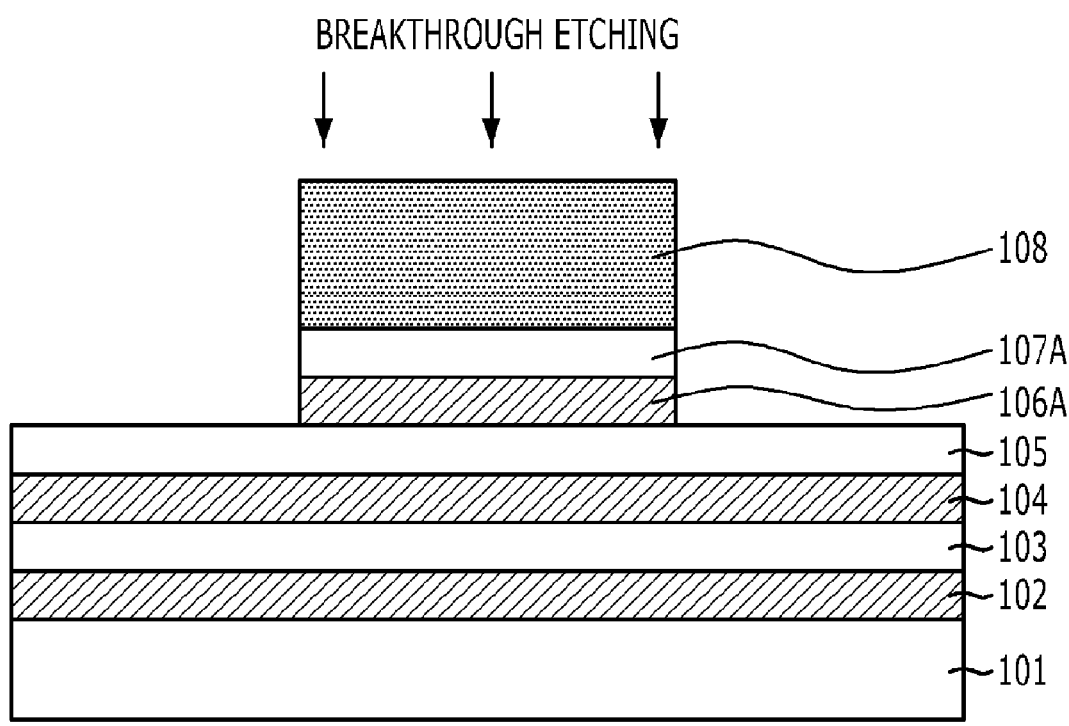

Referring to FIG. 3C, breakthrough (BT) etching is performed. The breakthrough etching is a process for removing polymer or residues generated in a previous etching process between repetitive etching processes. Therefore, the breakthrough etching is performed to remove polymer generated when etching the third conductive layer 106 before performing the slimming etching of the photoresist pattern 108.

For this purpose, the breakthrough etching may be performed using a $CF_4$ gas or an $O_2$ gas. Herein, it is preferable that the $CF_4$ gas is supplied at a flow rate of 30 sccm to 150 sccm, and the $O_2$ gas is supplied at a flow rate of 5 sccm to 200 sccm.

To minimize the loss of the photoresist pattern 108, a bias power of approximately 0 V to approximately 50 V may be supplied, and the breakthrough etching is also performed as much as necessary to remove only polymer.

As described above, it is possible to minimize the generation of the line edge roughness (LER) in a process for slimming the photoresist pattern 108 by removing the polymer, generated when etching the third conductive layer 106, using the breakthrough etching.

Figure 3D:
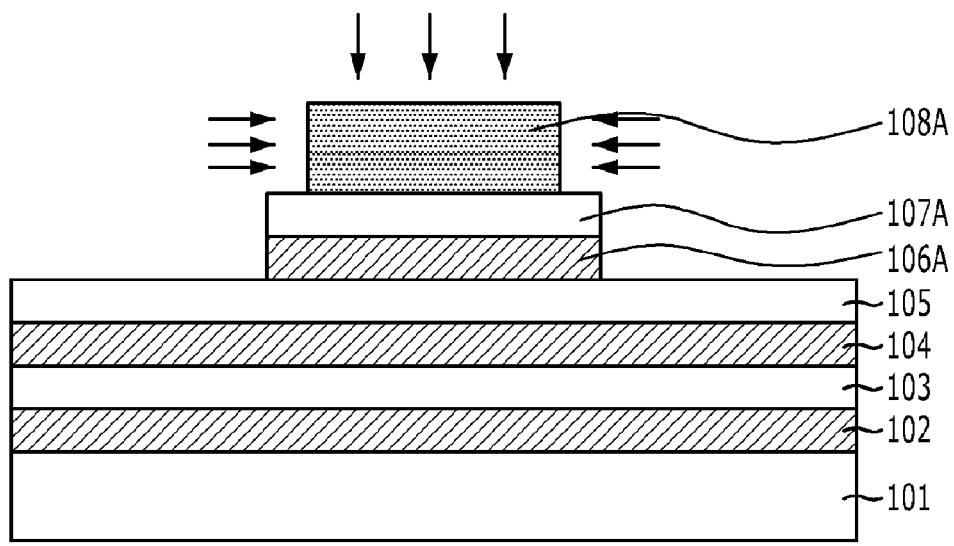

Referring to FIG. 3D, a first slimming process is performed on the photoresist pattern 108. A width and thickness of the photoresist pattern 108 are reduced by the first slimming process, and thus, a first slimmed photoresist pattern 108A is obtained.

The first slimming process is performed in-situ, and it may be performed in a pressure of 20 mTorr to 100 mTorr and with a source power of 1,000 W to 1,800 W. It is preferable not to supply a bias power to minimize the loss of the photoresist pattern 108. The first slimming process may be performed using a mixed gas of He and $O_2$, or a mixed gas of He, $O_2$ and $N_2$.

Since it is possible to change a slimming width of the photoresist pattern 108 based on a slimming processing time, a desired width can be achieved by adjusting the processing time.

Figure 3E:
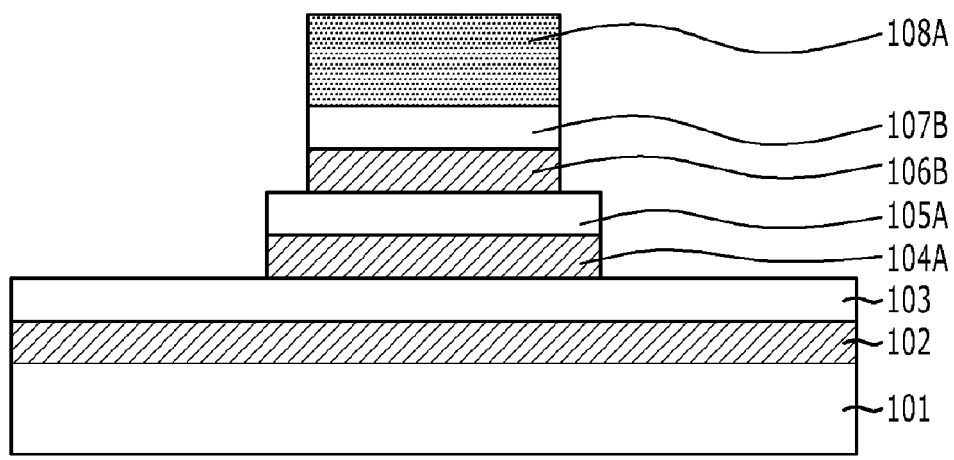

Referring to FIG. 3E, the first etched third insulation layer 107A and the first etched third conductive layer 106A are etched using the first slimmed photoresist pattern 108A as an etch barrier. Moreover, the second insulation layer 105 and the second conductive layer 104 are etched at the same time that the first etched third insulation layer 107A and the first etched third conductive layer 106A are etched. That is, an exposed portion of the second insulation layer 105 is etched when the first etched third insulation layer 107A is etched, and an exposed portion of the second conductive layer 104 is etched when the first etched third conductive layer 106A is etched, since the second and third insulation layers 105 and 107 are formed of the same material, and the second and third conductive layers 104 and 106 are formed of the same material.

The second insulation layer 105 and the second conductive layer 104 are etched to the same width as the third insulation layer 107 and the third conductive layer 106 are etched to in FIG. 3B. Therefore, a first etched second insulation layer 105A and a first etched second conductive layer 104A have a width greater than that of a second etched third insulation layer 107B and a second etched third conductive layer 106B.

It is preferable that the first etched third insulation layer 107A and the second insulation layer 105 are etched with an etch gas different from that used to etch the first etched third conductive layer 106A and the second conductive layer 104, as a result of considering the etch selectivity of each layer.

That is, in case the third and second insulation layers 107 and 105 include an oxide layer, it is preferable to etch the first etched third insulation layer 107A and the second insulation layer 105 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third and second conductive layers 106 and 104 are formed of polysilicon, it is preferable to etch the first etched third conductive layer 106A and the second conductive layer 104 with a silicon etch gas. The silicon etch gas may include a single gas of HBr or $Cl_2$, or a mixed gas of HBr and $Cl_2$. Moreover, the silicon etch gas may include an $O_2$ gas.

Subsequently, although it is not shown, the breakthrough etching is performed in the same manner as that described in FIG. 3C to remove polymer generated when etching the first etched third conductive layer 106A and the second conductive layer 104.

That is, the breakthrough etching may be performed using a $CF_4$ gas or an $O_2$ gas. Herein, it is preferable that the $CF_4$ gas is supplied at a flow rate of 30 sccm to 150 sccm, and the $O_2$ gas is supplied at a flow rate of 5 sccm to 200 sccm. To minimize the loss of the first slimmed photoresist pattern 108A, a bias power of approximately 0 V to approximately 50 V may be supplied, and the breakthrough etching is also performed as much as necessary to remove only polymer.

As described above, it is possible to minimize the generation of the LER in a subsequent slimming process of the first slimmed photoresist pattern 108A by removing the polymer through the breakthrough etching.

Figure 3F:
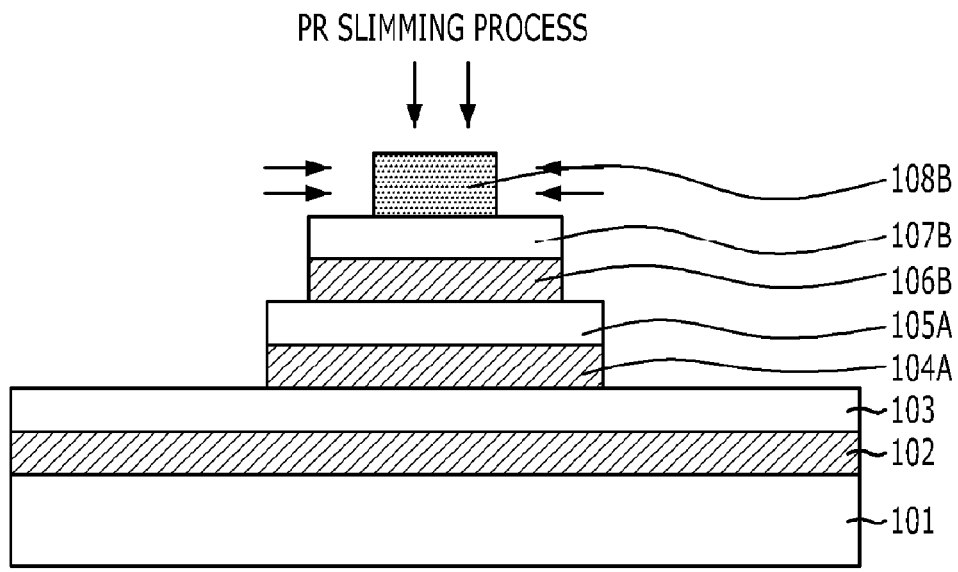

Referring to FIG. 3F, a second slimming process is performed on the first slimmed photoresist pattern 108A. A width and a thickness of the first slimmed photoresist pattern 108A are reduced by the second slimming process. As a result, a second slimmed photoresist pattern 108B is formed.

The second slimming process is performed under the same condition as that of the first slimming process described in FIG. 3D. That is, the second slimming process is performed in-situ and may be performed in a pressure of 20 mTorr to 100 mTorr and with a source power of 1,000 W to 1,800 W. To minimize the loss of the first slimmed photoresist pattern 108A, it is preferable not to supply a bias power or to supply the bias power of approximately 0 V to approximately 50 V. The second slimming process may be performed using a mixed gas of He and $O_2$, or a mixed gas of He, $O_2$ and $N_2$.

Since a slimming width of the first slimmed photoresist pattern 108A can be changed based on a slimming processing time, it is possible to obtain a desired width by adjusting the processing time.

Figure 3G:
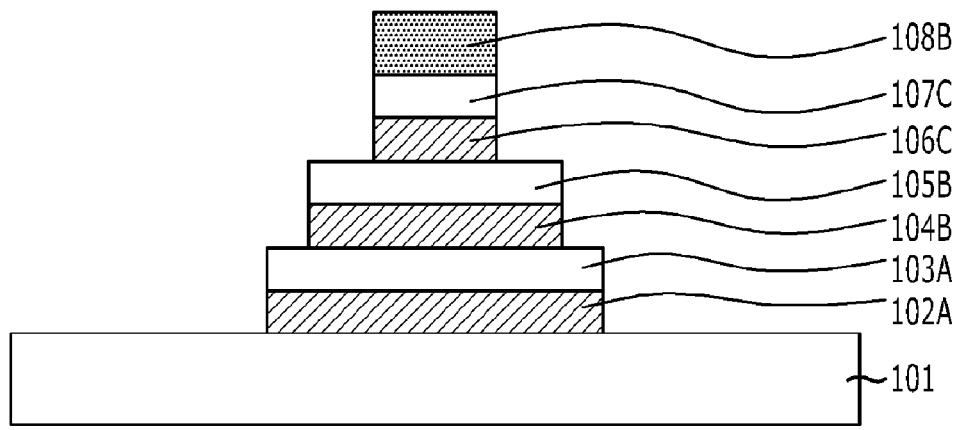

Referring to FIG. 3G, the second etched third insulation layer 107B and the second etched third conductive layer 106B are etched using the second slimmed photoresist pattern 108B as an etch barrier. Moreover, the first etched second insulation layer 105A and the first insulation layer 103 are etched at the same time when the second etched third insulation layer 107B is etched, and the first etched second conductive layer 104A and the first conductive layer 102 are etched at the same time when the second etched third conductive layer 106B is etched. That is, exposed portions of the first etched second insulation layer 105A and the first insulation layer 103 are also etched when the second etched third insulation layer 107B is etched, and exposed portions of the first etched second conductive layer 104A and the first conductive layer 102 are also etched when the second etched third conductive layer 106B is etched, since the first, second and third insulation layers 103, 105 and 107 are formed of the same material, and the first, second and third conductive layers 102, 104 and 106 are formed of the same material.

Particularly, the first insulation layer 103 and the first conductive layer 102 are etched to the same width as the second insulation layer 105 and the second conductive layer 104 are etched to in FIG. 3E. Similarly, the first etched second insulation layer 105A and the first etched second conductive layer 104A are etched to the same width as the first etched third insulation layer 107A and the first etched third conductive layer 106A are etched to in FIG. 3E. As a result, there is formed a structure in a step shape where widths are gradually reduced in order of a first etched first insulation layer 103A and a first etched first conductive layer 102A, a second etched second insulation layer 105B and a second etched second conductive layer 104B, and a third etched third insulation layer 107C and a third etched third conductive layer 106C.

For this purpose, it is preferable that the layers 107B, 105A, and 103 are etched with an etch gas different from that used to etch the layers 106B, 104A, and 102 as a result of considering the etch selectivity of each layer.

That is, in case the third, second, and first insulation layers 107, 105, and 103 include an oxide layer, it is preferable to etch the layers 107B, 105A, and 103 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third, second, and first conductive layer 106, 104, and 102 are formed of polysilicon, it is preferable to etch the layers 106B, 104A, and 102 with a silicon etch gas. The silicon etch gas may include a single gas of HBr or $Cl_2$, or a mixed gas of HBr and $Cl_2$. Moreover, the silicon etch gas may include an $O_2$ gas.

As shown above, it is possible to form a multi-step structure having 4 or more steps by repeatedly performing the etching in FIG. 3B, the breakthrough etching in FIG. 3C, the slimming etching in FIG. 3D, and the etching in FIG. 3E.

Further, by implementing the method shown in FIGS. 3A to 3G, it is possible to minimize the generation of the LER of the photoresist pattern 108 when performing the slimming etching, and to uniformly maintain the width between steps by performing the breakthrough etching for removing the polymer before the slimming etching of the photoresist pattern 108.

FIGS. 4A to 4G illustrate a method for fabricating a non-volatile memory device in accordance with a second embodiment of the present invention.

Figure 4A:
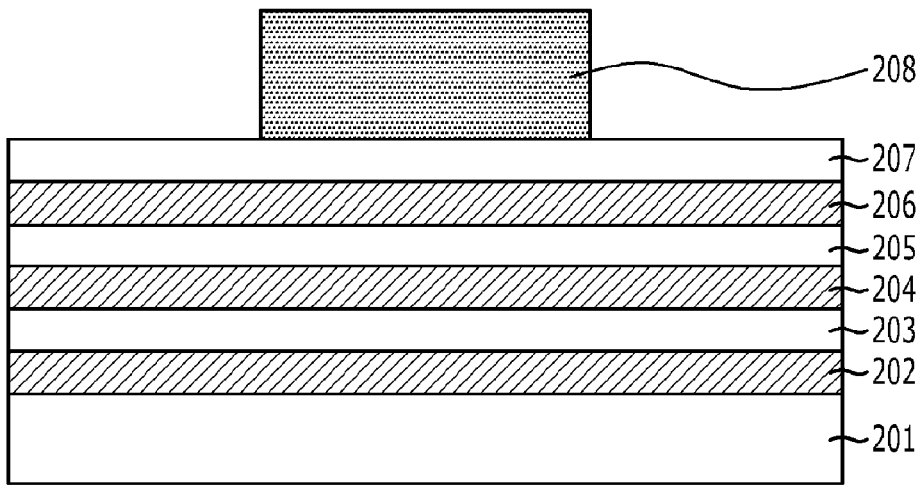
FIGS. 4A to 4G illustrate a method for fabricating a nonvolatile memory device in accordance with a second embodiment of the present invention.

Referring to FIG. 4A, a first conductive layer 202 is formed on a silicon substrate 201, and a first insulation layer 203 is formed on the first conductive layer 202. The first conductive layer 202 is to form a memory cell, and thus, may be formed with polysilicon. The first insulation layer 203 is for the inter-layer insulation of each memory cell, and thus, may be formed of an oxide layer.

After that, a second conductive layer 204 and a second insulation layer 205 are sequentially formed on the first insulation layer 203. A third conductive layer 206 is formed on the second insulation layer 205, and a third insulation layer 207 is formed on the third conductive layer 206.

For simplifying the below explanation, it is assumed that the stacked structure is formed by repeatedly stacking a conductive layer and an insulation layer 3 times, but the present invention is not limited thereto. Although it is not shown, the stacked structure may be formed by repeatedly stacking the conductive layer and the insulation layer 4 or more times. Preferably, the stacked structure is formed by repeatedly stacking the conductive layer and the insulation layer 8 or more times.

Subsequently, a photoresist pattern 208 defining a pattern region is formed on the third insulation layer 207. The photoresist pattern 208 is formed by coating photoresist on the third insulation layer 207 and patterning the coated photoresist to define the pattern region through exposure and development processes. Herein, the photoresist is preferably formed to become the photoresist pattern 208 using an I-Line exposure source. A thickness of the photoresist pattern 208 may be at least 20,000 Å, as a result of considering a processing margin of slimming etching and multi-stack etching processes performed on the stacked structure of the conductive layers and the insulation layers. Preferably, the thickness of the photoresist pattern 208 is in a range of 20,000 Å to 25,000 Å. In case of stacking the conductive layers and the insulation layers 8 or more times, the thickness of the photoresist pattern 208 may be at least 45,000 Å.

Figure 4B:
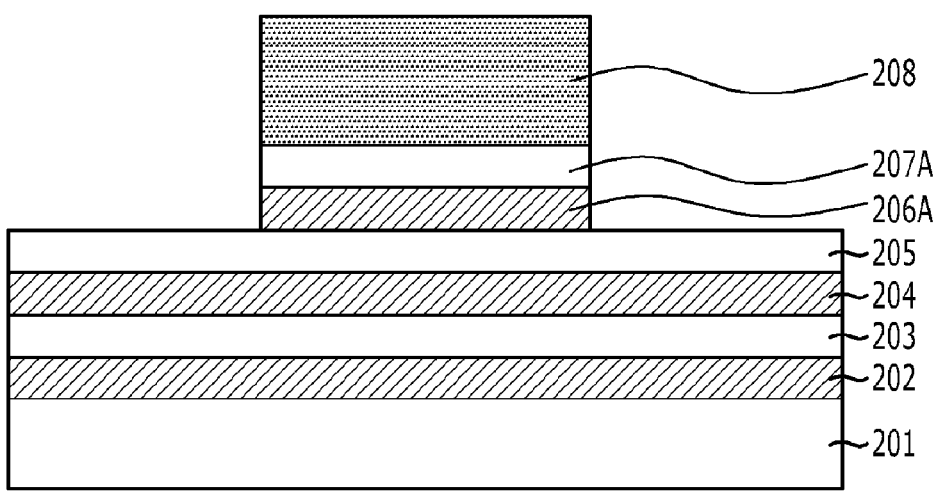

Referring to FIG. 4B, the third insulation layer 207 and the third conductive layer 206 are selectively etched using the photoresist pattern 208 as an etch barrier.

Herein, it is preferable to etch the third insulation layer 207 and the third conductive layer 206 with different etch gases since the third insulation layer 207 and the third conductive layer 206 have different etch rates.

In case the third insulation layer 207 is formed of the oxide layer, it is preferable to etch the third insulation layer 207 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third conductive layer 206 is formed of polysilicon, it is preferable to etch the third conductive layer 206 with a silicon etch gas. The silicon etch gas may include a single gas selected from the group consisting of HBr, Cl$_2$ and O$_2$, or a mixed gas of HBr and O$_2$.

The third conductive layer 206 is selectively etched without the loss of the second insulation layer 205 by etching the third insulation layer 207 and the third conductive layer 206 with different etch gases, as a result of considering the etch selectivity of each of the third insulation layer 207 and the third conductive layer 206. As a result, a first etched third insulation layer 207A and a first etched third conductive layer 206A are obtained.

Figure 4C:
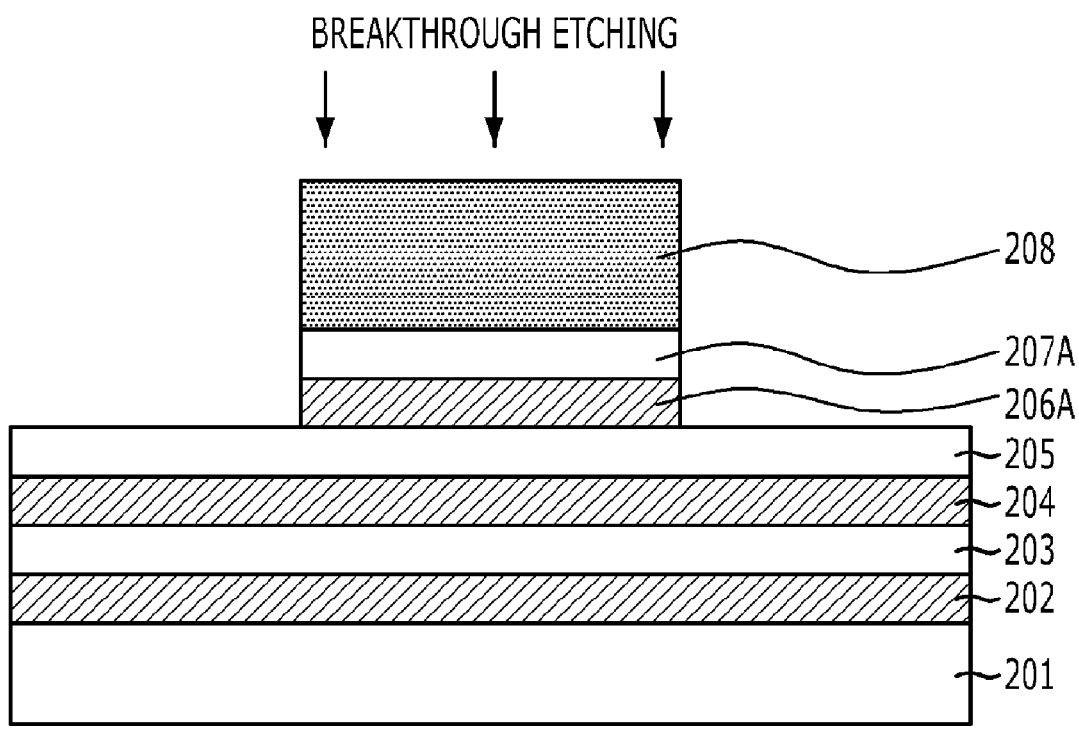

Referring to FIG. 4C, breakthrough etching is performed. The breakthrough etching is a process for removing polymer or residues generated in a previous etching process between repetitive etching processes. Therefore, the breakthrough etching is performed to remove polymer generated when etching the third conductive layer 206 before performing the slimming etching of the photoresist pattern 208.

For this purpose, the breakthrough etching may be performed using a CF$_4$ gas or an O$_2$ gas. Herein, it is preferable that the CF$_4$ gas is supplied at a flow rate of 30 sccm to 150 sccm, and the O$_2$ gas is supplied at a flow rate of 5 sccm to 200 sccm.

To minimize the loss of the photoresist pattern 208, a bias power of approximately 0 V to approximately 50 V may be supplied, and the breakthrough etching is also performed as much as necessary to remove only the polymer.

As described above, it is possible to minimize the generation of LER in a process for slimming the photoresist pattern 208 by removing the polymer, generated when etching the third conductive layer 206, using the breakthrough etching.

Figure 4D:
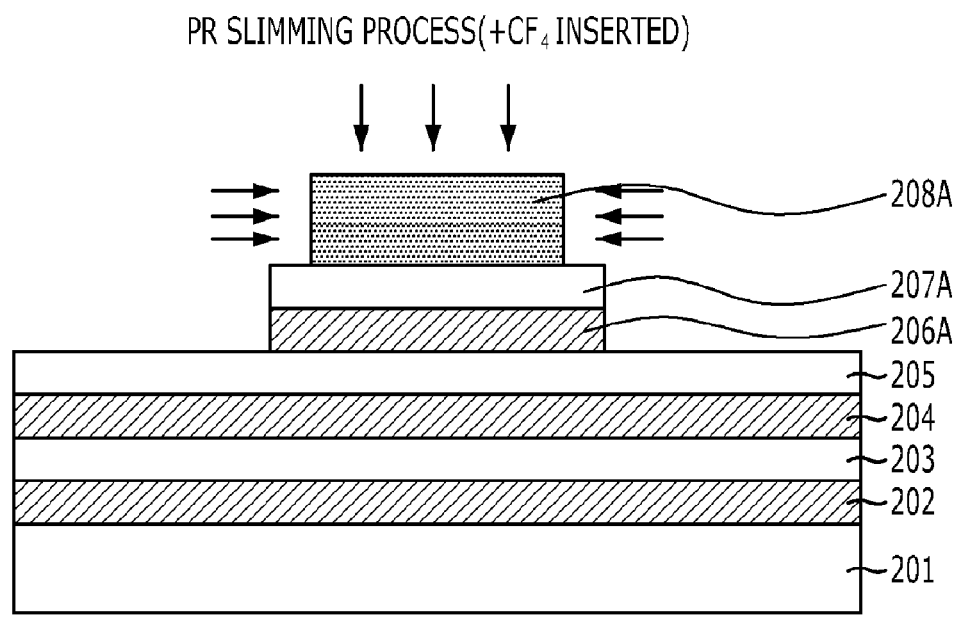

Referring to FIG. 4D, a first slimming process is performed on the photoresist pattern 208. A width and thickness of the photoresist pattern 208 are reduced by the first slimming process, and thus, a first slimmed photoresist pattern 208A is obtained.

The first slimming process is performed in-situ, and it may be performed in a pressure of 20 mTorr to 100 mTorr and with a source power of 1,000 W to 1,800 W. It is preferable not to supply a bias power to minimize the loss of the photoresist pattern 208. The first slimming process may be performed using a mixed gas of He and O$_2$, or a mixed gas of He, O$_2$ and N$_2$.

Herein, the first slimming process is performed by inserting a CF$_4$ gas to the above mixed gas. When inserting the CF$_4$ gas, polymer is deposited on the photoresist pattern 208 by a carbon component. As a result, the loss of an upper portion of the photoresist pattern 208 is reduced in the slimming process, and a slimming speed is improved by at least 30%. It is preferable that the CF$_4$ gas is inserted to the above mixed gas by adjusting its flow rate in a range of 3% to 10% of that of the above mixed gas. This is because the oxide layer or the insulation layer disposed under the photoresist pattern 208 may be damaged if the flow rate of the CF$_4$ gas exceeds 10% of the flow rate of the mixed gas.

Since it is possible to change a slimming width of the photoresist pattern 208 based on a slimming processing time, a desired width can be achieved by adjusting the processing time.

Figure 4E:
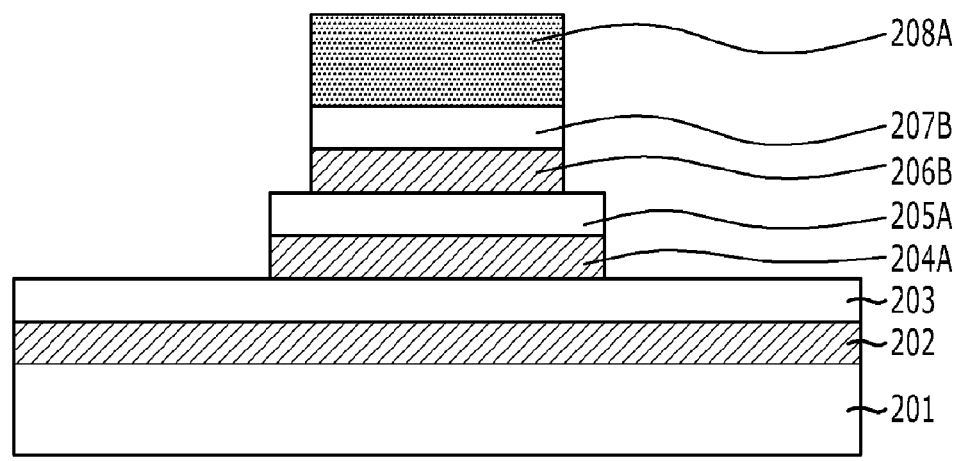

Referring to FIG. 4E, the first etched third insulation layer 207A and the first etched third conductive layer 206A are etched using the first slimmed photoresist pattern 208A as an etch barrier. Moreover, the second insulation layer 205 and the second conductive layer 204 are etched at the same time that the first etched third insulation layer 207A and the first etched third conductive layer 206A are etched. That is, an exposed portion of the second insulation layer 205 is etched when the first etched third insulation layer 207A is etched, and an exposed portion of the second conductive layer 204 is etched when the first etched third conductive layer 206A is etched, since the second and third insulation layers 205 and 207 are formed of the same material, and the second and third conductive layers 204 and 206 are formed of the same material.

The second insulation layer 205 and the second conductive layer 204 are etched to the same width as the third insulation layer 207 and the third conductive layer 206 are etched to in FIG. 4B. Therefore, a first etched second insulation layer 205A and a first etched second conductive layer 204A have a width greater than that of a second etched third insulation layer 207B and a second etched third conductive layer 206B.

It is preferable that the first etched third insulation layer 207A and the second insulation layer 205 are etched with an etch gas different from that used to etch the first etched third conductive layer 206A and the second conductive layer 204, as a result of considering the etch selectivity of each layer.

That is, in case the third and second insulation layers 207 and 205 include an oxide layer, it is preferable to etch the layers 207A and 205 with an oxide etch gas. The oxide etch gas may include a single gas or a mixed gas selected from the group consisting of CF$_4$, CHF$_3$ and CH$_2$F$_2$. Furthermore, a He gas or an Ar gas may be used as an insert gas.

In case the third and second conductive layers 206 and 204 are formed of polysilicon, it is preferable to etch the layers 206A and 204 with a silicon etch gas. The silicon etch gas may include a single gas of HBr or Cl$_2$, or a mixed gas of HBr and Cl$_2$. Moreover, the silicon etch gas may include an O$_2$ gas.

Subsequently, although it is not shown, the breakthrough etching is performed in the same manner as that described in FIG. 4C to remove polymer generated when etching the first etched third conductive layer 206A and the second conductive layer 204.

That is, the breakthrough etching may be performed using a CF$_4$ gas or an O$_2$ gas. Herein, it is preferable that the CF$_4$ gas is supplied at a flow rate of 30 sccm to 150 sccm, and the O$_2$ gas is supplied at a flow rate of 5 sccm to 200 sccm. To minimize the loss of the first slimmed photoresist pattern 208A, a bias power of approximately 0 V to approximately 50 V may be supplied, and the breakthrough etching is also performed as much as necessary to remove only polymer.

As described above, it is possible to minimize the generation of the LER in a subsequent slimming process of the first slimmed photoresist pattern 208A by removing the polymer through the breakthrough etching.

Figure 4F:
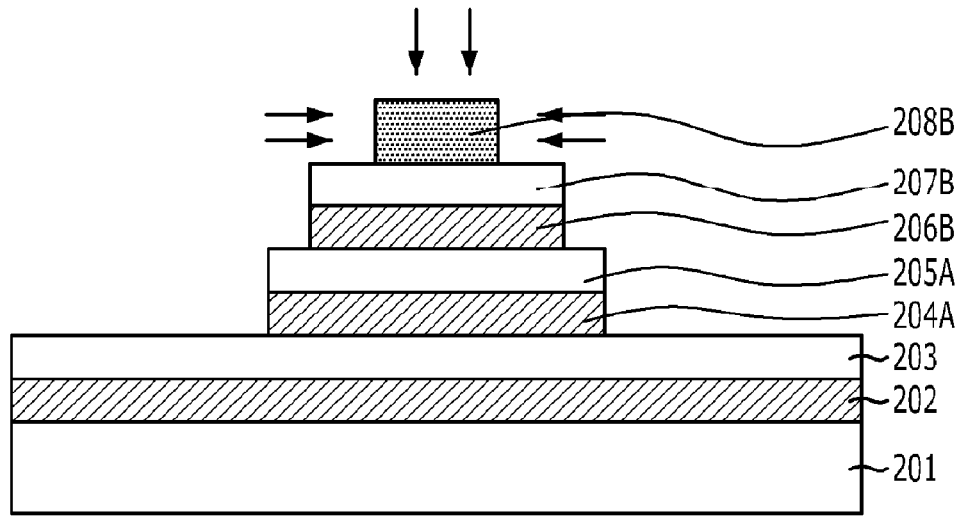

Referring to FIG. 4F, a second slimming process is performed on the first slimmed photoresist pattern 208A. A width and a thickness of the first slimmed photoresist pattern 208A are reduced by the second slimming process. As a result, a second slimmed photoresist pattern 208B is formed.

The second slimming process is performed under the same condition as that of the first slimming process described in FIG. 4D. That is, the second slimming process is performed in-situ and may be performed in a pressure of 20 mTorr to 100 mTorr and with a source power of 1,000 W to 1,800 W. To minimize the loss of the first slimmed photoresist pattern 208A, it is preferable not to supply a bias power or to supply the bias power of approximately 0 V to approximately 50 V. The second slimming process may be performed using a mixed gas of He and O$_2$, or a mixed gas of He, O$_2$ and N$_2$.

Herein, the second slimming process is performed by inserting a CF$_4$ gas to the above mixed gas. When inserting the CF$_4$ gas, polymer is deposited on the first slimmed photoresist pattern 208A by a carbon component. As a result, the loss of an upper portion of the first slimmed photoresist pattern 208A is reduced in the slimming process, and a slimming speed is improved by at least 30%. It is preferable that the $CF_4$ gas is inserted to the above mixed gas by adjusting its flow rate in a range of 3% to 10% of that of the above mixed gas. This is because the oxide layer or the insulation layer disposed under the first slimmed photoresist pattern 208A may be damaged if the flow rate of the $CF_4$ gas exceeds 10% of the flow rate of the mixed gas.

Since a slimming width of the first slimmed photoresist pattern 208A can be changed based on a slimming processing time, it is possible to obtain a desired width by adjusting the processing time.

Figure 4G:
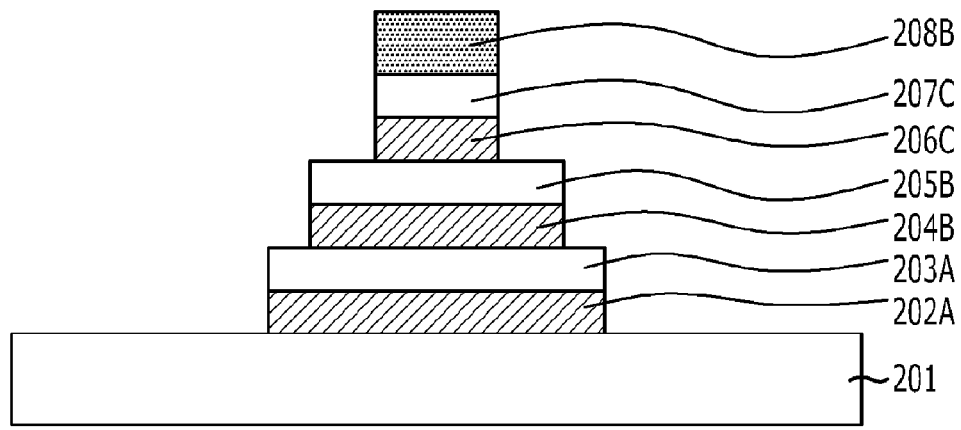

Referring to FIG. 4G, the second etched third insulation layer 207B and the second etched third conductive layer 206B are etched using the second slimmed photoresist pattern 208B as an etch barrier. Moreover, the first etched second insulation layer 205A and the first insulation layer 203 are etched at the same time when the second etched third insulation layer 207B is etched, and the first etched second conductive layer 204A and the first conductive layer 202 are etched at the same time when the second etched third conductive layer 206B is etched. That is, exposed portions of the first etched second insulation layer 205A and the first insulation layer 203 are also etched when the second etched third insulation layer 207B is etched, and exposed portions of the first etched second conductive layer 204A and the first conductive layer 202 are also etched when the second etched third conductive layer 206B is etched, since the first, second, and third insulation layers 203, 205, and 207 are formed of the same material, and the first, second, and third conductive layers 202, 204, and 206 are formed of the same material.

Particularly, the first insulation layer 203 and the first conductive layer 202 are etched to the same width as the second insulation layer 205 and the second conductive layer 204 are etched to in FIG. 4E. Similarly, the first etched second insulation layer 205A and the first etched second conductive layer 204A are etched to the same width as the first etched third insulation layer 207A and the first etched third conductive layer 206A are etched to in FIG. 4E. As a result, there is formed a structure in a step shape where widths are gradually reduced in order of a first etched first insulation layer 203A and a first etched first conductive layer 202A, a second etched second insulation layer 205B and a second etched second conductive layer 204B, and a third etched third insulation layer 207C and a third etched third conductive layer 206C.

For this purpose, it is preferable that the layers 207B, 205A, and 203 are etched with an etch gas different from that used to etch the layers 206B, 204A, and 202 as a result of considering the etch selectivity of each layer.

That is, in case the third, second, and first insulation layers 207, 205, and 203 include an oxide layer, it is preferable to etch the layers 207B, 205A, and 203 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third, second, and first conductive layer 206, 204, and 202 are formed of polysilicon, it is preferable to etch the layers 206B, 204A, and 202 with a silicon etch gas. The silicon etch gas may include a single gas of HBr or $O_2$, or a mixed gas of HBr and $Cl_2$. Moreover, the silicon etch gas may include an $O_2$ gas.

As shown above, it is possible to form a multi-step structure having 4 or more steps by repeatedly performing the etching in FIG. 4B, the breakthrough etching in FIG. 4C, the slimming etching in FIG. 4D, and the etching in FIG. 4E.

Further, by implementing the method shown in FIGS. 4A to 4G, it is possible to minimize the generation of the LER of the photoresist pattern 208 when performing the slimming etching, and to uniformly maintain the width between steps by performing the breakthrough etching for removing the polymer before the slimming etching of the photoresist pattern 208.

FIGS. 5A to 5H illustrate a method for fabricating a nonvolatile memory device in accordance with a third embodiment of the present invention.

Figure 5A:
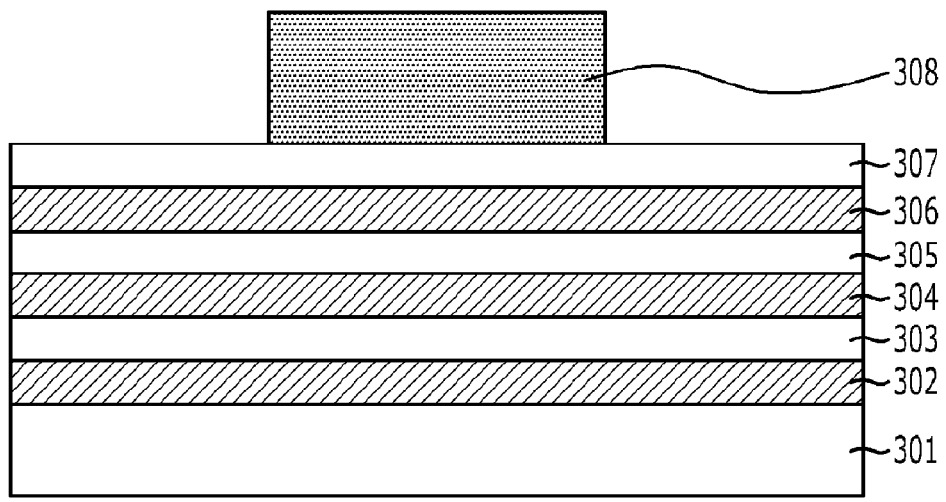
FIGS. 5A to 5H illustrate a method for fabricating a nonvolatile memory device in accordance with a third embodiment of the present invention.

Referring to FIG. 5A, a first conductive layer 302 is formed on a silicon substrate 301, and a first insulation layer 303 is formed on the first conductive layer 302. The first conductive layer 302 is to form a memory cell, and thus, may be formed with polysilicon. The first insulation layer 303 is for the inter-layer insulation of each memory cell, and thus, may be formed of an oxide layer.

After that, a second conductive layer 304 and a second insulation layer 305 are sequentially formed on the first insulation layer 303. A third conductive layer 306 is formed on the second insulation layer 305, and a third insulation layer 307 is formed on the third conductive layer 306.

For simplifying the below explanation, it is assumed that the stacked structure is formed by repeatedly stacking a conductive layer and an insulation layer 3 times, but the present invention is not limited thereto. Although it is not shown, the stacked structure may be formed by repeatedly stacking the conductive layer and the insulation layer 4 or more times. Preferably, the stacked structure is formed by repeatedly stacking the conductive layer and the insulation layer 8 or more times.

Subsequently, a photoresist pattern 308 defining a pattern region is formed on the third insulation layer 307. The photoresist pattern 308 is formed by coating photoresist on the third insulation layer 307 and patterning the coated photoresist to define the pattern region through exposure and development processes. Herein, the photoresist is preferably formed to become the photoresist pattern 308 using an I-Line exposure source. A thickness of the photoresist pattern 308 may be at least 20,000 Å, as a result of considering a processing margin of slimming etching and multi-stack etching processes performed on the stacked structure of the conductive layers and the insulation layers. Preferably, the thickness of the photoresist pattern 308 is in a range of 20,000 Å to 25,000 Å. In case of stacking the conductive layers and the insulation layers 8 or more times, the thickness of the photoresist pattern 308 may be at least 45,000 Å.

Figure 5B:
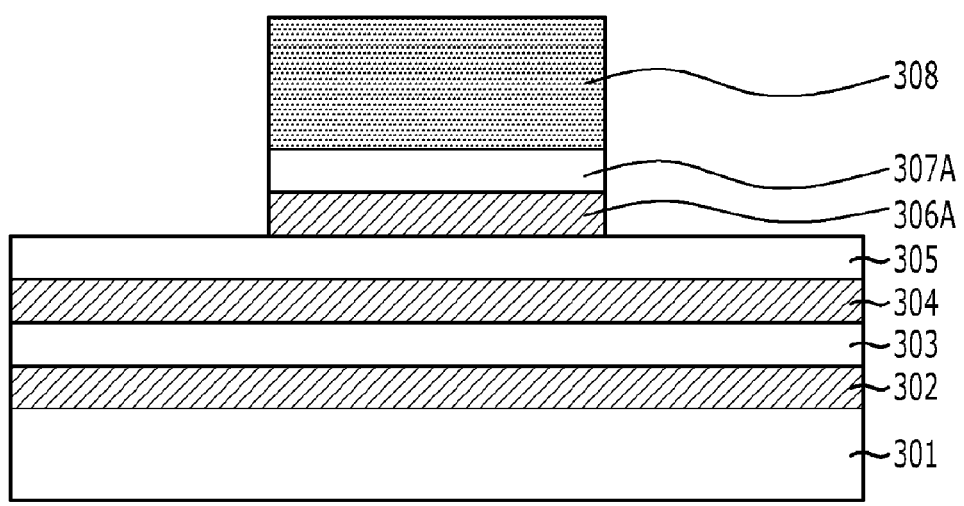

Referring to FIG. 5B, the third insulation layer 307 and the third conductive layer 306 are selectively etched using the photoresist pattern 308 as an etch barrier.

Herein, it is preferable to etch the third insulation layer 307 and the third conductive layer 306 with different etch gases since the third insulation layer 307 and the third conductive layer 306 have different etch rates.

In case the third insulation layer 307 is formed of the oxide layer, it is preferable to etch the third insulation layer 307 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third conductive layer 306 is formed of polysilicon, it is preferable to etch the third conductive layer 306 with a silicon etch gas. The silicon etch gas may include a single gas selected from the group consisting of HBr, $Cl_2$ and $O_2$, or a mixed gas of HBr and $Cl_2$.

The third conductive layer 306 is selectively etched without the loss of the second insulation layer 305 by etching the third insulation layer 307 and the third conductive layer 306 with different etch gases, as a result of considering the etch selectivity of each of the third insulation layer 307 and the third conductive layer 306. As a result, a first etched third insulation layer 307A and a first etched third conductive layer 306A are obtained.

Figure 5C:
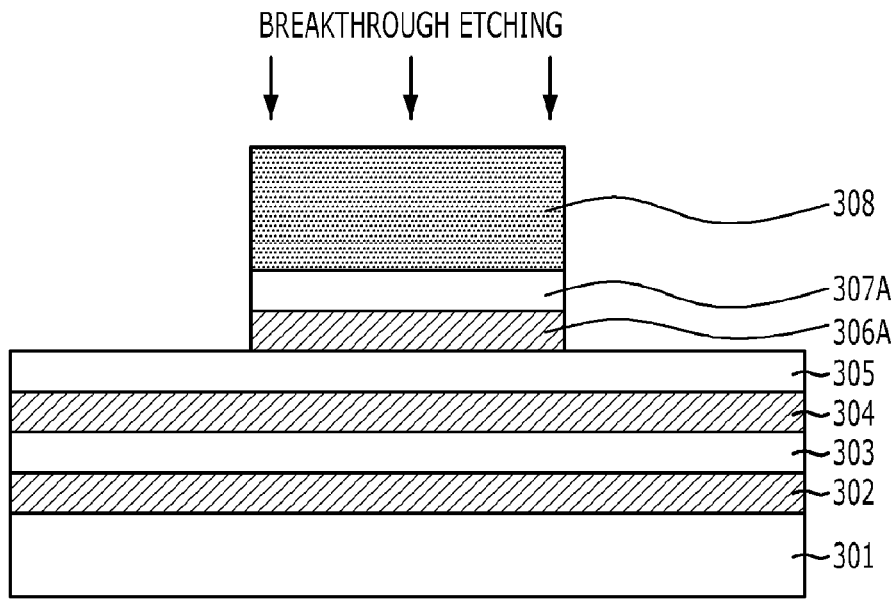

Referring to FIG. 5C, breakthrough etching is performed. The breakthrough etching is a process for removing polymer or residues generated in a previous etching process between repetitive etching processes. Therefore, the breakthrough etching is performed to remove polymer generated when etching the third conductive layer 306 before performing the slimming etching of the photoresist pattern 308.

For this purpose, the breakthrough etching may be performed using a $CF_4$ gas or an $O_2$ gas. Herein, it is preferable that the $CF_4$ gas is supplied at a flow rate of 30 sccm to 150 sccm, and the $O_2$ gas is supplied at a flow rate of 5 sccm to 200 sccm.

To minimize the loss of the photoresist pattern 308, a bias power of approximately 0 V to approximately 50 V may be supplied, and the breakthrough etching is also performed as much as necessary to remove only the polymer.

As described above, it is possible to minimize the generation of LER in a process for slimming the photoresist pattern 308 by removing the polymer, generated when etching the third conductive layer 306, using the breakthrough etching.

Figure 5D:
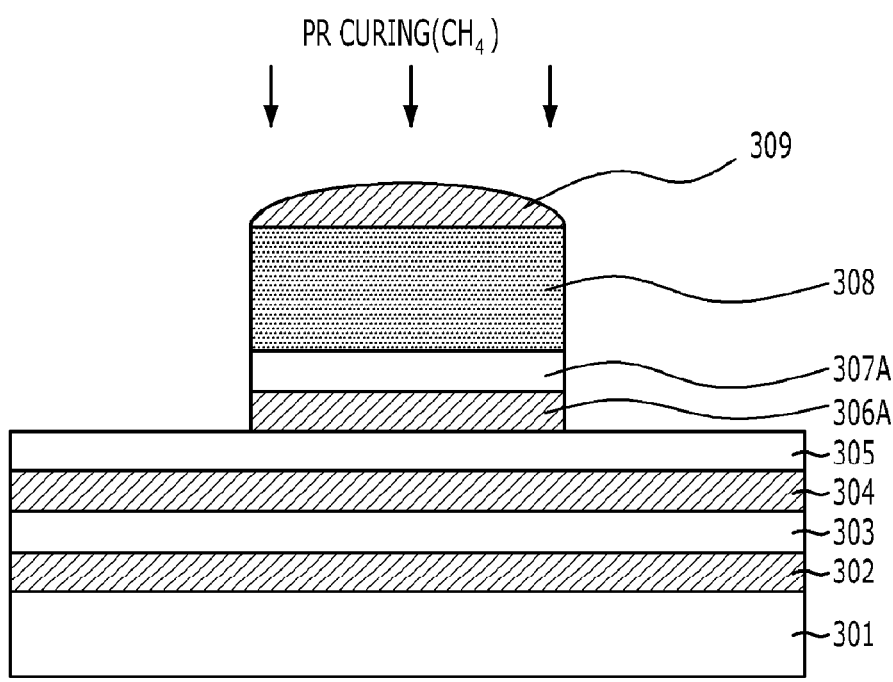

Referring to FIG. 5D, a polymer layer 309 is formed on the photoresist pattern 308. The polymer layer 309 forms a protection layer to minimize the loss of an upper portion of the photoresist pattern 308 in a subsequent photoresist slimming process, and thus, it may be formed using a CH series gas. The CH series gas may include one selected from the group consisting of $CH_4$, $CH_2F_2$, $C_2H_2$, and $C_2H_4$.

When forming the polymer layer 309, it is preferable that a source power is not supplied and a bias power is supplied in a range of 200 W to 400 W. Since the photoresist pattern 308 is simultaneously hardened by high ion energy when performing the process for forming the polymer layer 309 by supplying only the bias power without supplying the source power, it is possible to reduce the loss of the upper portion of the photoresist pattern 308 during the loss of a sidewall of the photoresist pattern 308 in the subsequent slimming process. Furthermore, when supplying only the bias power, the straightness of an ion is strong, and thus the polymer layer 309 is not formed on sidewalls of the photoresist pattern 308 and its underlying pattern. Therefore, it is possible to concentrically perform the slimming process on the sidewall of the photoresist pattern 308, while reducing the loss of the upper portion of the photoresist pattern 308.

As described above, when reducing the loss of the upper portion of the photoresist pattern 308 in the subsequent slimming process by forming the polymer layer 309, it is possible to maintain the thickness of the photoresist pattern 308 greater than a certain level in the etching process that is repeatedly performed, and thus, a sufficient etching margin may be obtained.

Figure 5E:
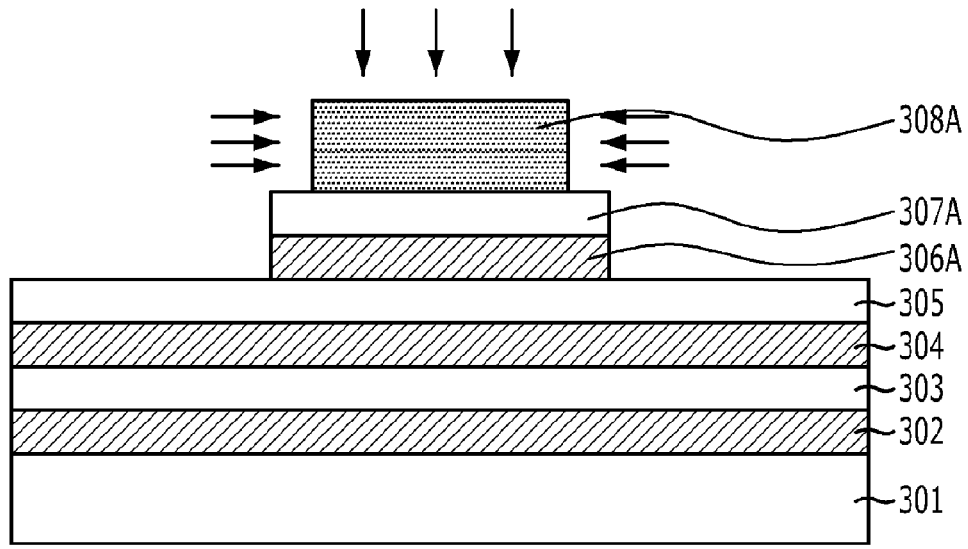

Referring to FIG. 5E, a first slimming process is performed on the photoresist pattern 308. A width and thickness of the photoresist pattern 308 are reduced by the first slimming process, and thus a first slimmed photoresist pattern 308A is obtained. Here, the loss of the upper portion of the photoresist pattern 308 may be less than the loss of the sidewall of the photoresist pattern 308 because of the polymer layer 309 on the photoresist pattern 308 as described in FIG. 5D.

The first slimming process is performed in-situ, and it may be performed in a pressure of 20 mTorr to 100 mTorr and with a source power of 1,000 W to 1,800 W. It is preferable not to supply a bias power to minimize the loss of the photoresist pattern 308. The first slimming process may be performed using a mixed gas of He and $O_2$, or a mixed gas of He, $O_2$ and $N_2$.

Herein, the first slimming process is performed by inserting a $CF_4$ gas to the above mixed gas. When inserting the $CF_4$ gas, polymer is deposited on the photoresist pattern 308 by a carbon component. As a result, the loss of an upper portion of the photoresist pattern 308 is reduced in the slimming process, and a slimming speed is improved by at least 30%. It is preferable that the $CF_4$ gas is inserted to the above mixed gas by adjusting its flow rate in a range of 3% to 10% of that of the above mixed gas. This is because the oxide layer or the insulation layer disposed under the photoresist pattern 308 may be damaged if the flow rate of the $CF_4$ gas exceeds 10% of the flow rate of the mixed gas.

Since it is possible to change a slimming width of the photoresist pattern 308 based on a slimming processing time, a desired width can be achieved by adjusting the processing time.

Figure 5F:
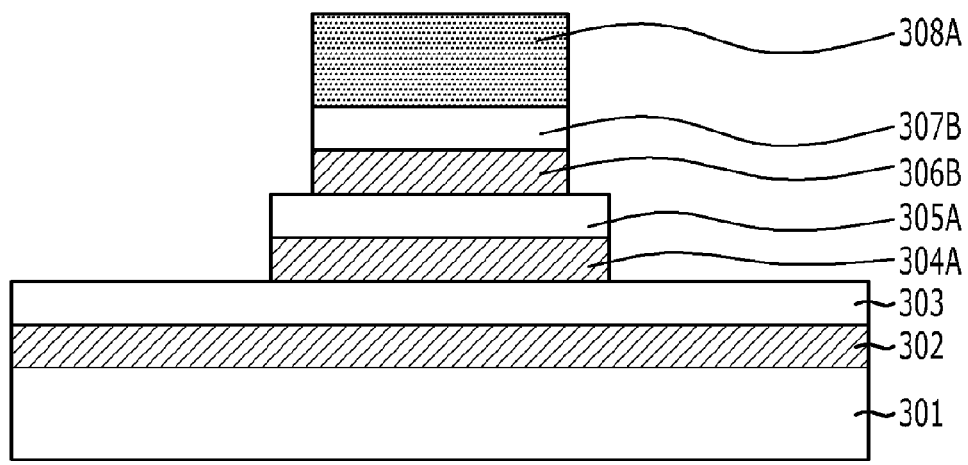

Referring to FIG. 5F, the first etched third insulation layer 307A and the first etched third conductive layer 306A are etched using the first slimmed photoresist pattern 308A as an etch barrier. Moreover, the second insulation layer 305 and the second conductive layer 304 are etched at the same time that the first etched third insulation layer 307A and the first etched third conductive layer 306A are etched. That is, an exposed portion of the second insulation layer 305 is etched when the first etched third insulation layer 307A is etched, and an exposed portion of the second conductive layer 304 is etched when the first etched third conductive layer 306A is etched, since the second and third insulation layers 305 and 307 are formed of the same material, and the second and third conductive layers 304 and 306 are formed of the same material.

The second insulation layer 305 and the second conductive layer 304 are etched to the same width as the third insulation layer 307 and the third conductive layer 306 are etched to in FIG. 5B. Therefore, a first etched second insulation layer 305A and a first etched second conductive layer 304A have a width greater than that of a second etched third insulation layer 307B and a second etched third conductive layer 306B.

It is preferable that the first etched third insulation layer 307A and the second insulation layer 305 are etched with an etch gas different from that used to etch the first etched third conductive layer 306A and the second conductive layer 304, as a result of considering the etch selectivity of each layer.

That is, in case the third and second insulation layers 307 and 305 include an oxide layer, it is preferable to etch the layers 307A and 305 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third and second conductive layers 306 and 304 are formed of polysilicon, it is preferable to etch the layers 306A and 304 with a silicon etch gas. The silicon etch gas may include a single gas of HBr or $Cl_2$, or a mixed gas of HBr and $O_2$. Moreover, the silicon etch gas may include an $O_2$ gas.

Subsequently, although it is not shown, the breakthrough etching is performed in the same manner as that described in FIG. 5C to remove polymer generated when etching the first etched third conductive layer 306A and the second conductive layer 304.

That is, the breakthrough etching may be performed using a $CF_4$ gas or an $O_2$ gas. Herein, it is preferable that the $CF_4$ gas is supplied at a flow rate of 30 sccm to 150 sccm, and the $O_2$ gas is supplied at a flow rate of 5 sccm to 200 sccm.

As described above, it is possible to minimize the generation of the LER in a subsequent slimming process of the first slimmed photoresist pattern 308A by removing the polymer through the breakthrough etching.

Subsequently, although it is not shown, a polymer layer (not shown) is formed on the first slimmed photoresist pattern 308A in the same manner as in FIG. 5D.

That is, when reducing the loss of the upper portion of the first slimmed photoresist pattern 308A in the subsequent slimming process by forming the polymer layer (not shown), it is possible to maintain the thickness of the first slimmed photoresist pattern 308A greater than a certain level in the etching process that is repeatedly performed, and thus, an etching margin may be secured. Here, the polymer layer may be formed by using a CH series gas and supplying a bias power in a range of 200 W to 400 W without supplying a source power.

Figure 5G:
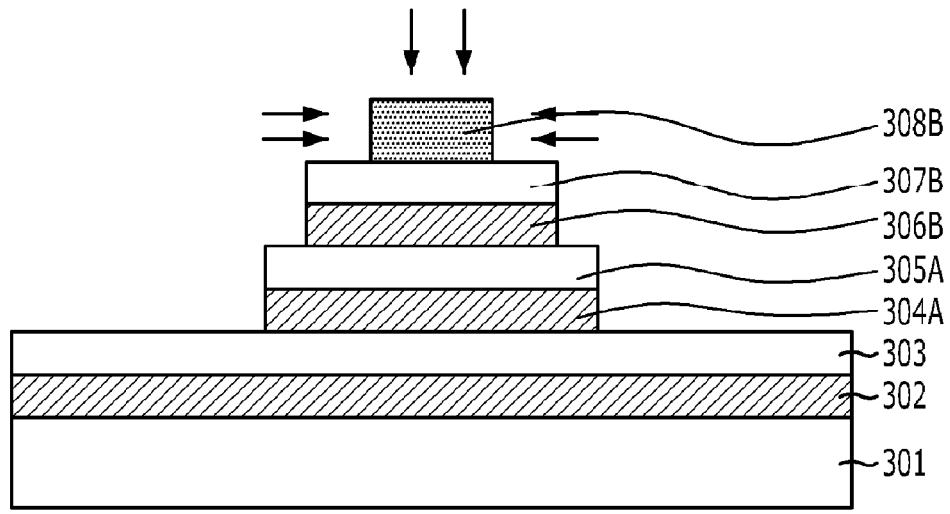

Referring to FIG. 5G, a second slimming process is performed on the first slimmed photoresist pattern 308A. A width and a thickness of the first slimmed photoresist pattern 308A are reduced by the second slimming process. As a result, a second slimmed photoresist pattern 308B is formed. Although it is not shown in FIG. 5F, the loss of an upper portion of the first slimmed photoresist pattern 308A may be less than the loss of a sidewall of the first slimmed photoresist pattern 308A due to the polymer layer (not shown) on the first slimmed photoresist pattern 308A.

The second slimming process is performed under the same condition as that of the first slimming process described in FIG. 5E. That is, the second slimming process is performed in-situ and may be performed in a pressure of 20 mTorr to 100 mTorr and with a source power of 1,000 W to 1,800 W. To minimize the loss of the first slimmed photoresist pattern 308A, it is preferable not to supply a bias power or to supply the bias power of approximately 0V to approximately 50 V. The second slimming process may be performed using a mixed gas of He and $O_2$, or a mixed gas of He, $O_2$ and $N_2$.

Herein, the second slimming process is performed by inserting a $CF_4$ gas to the above mixed gas. When inserting the $CF_4$ gas, polymer is deposited on the first slimmed photoresist pattern 308A by a carbon component. As a result, the loss of an upper portion of the first slimmed photoresist pattern 308A is reduced in the slimming process, and a slimming speed is improved by at least 30%. It is preferable that the $CF_4$ gas is inserted to the above mixed gas by adjusting its flow rate in a range of 3% to 10% of that of the above mixed gas. This is because the oxide layer or the insulation layer disposed under the first slimmed photoresist pattern 308A may be damaged if the flow rate of the $CF_4$ gas exceeds 10% of the flow rate of the mixed gas.

Since a slimming width of the first slimmed photoresist pattern 308A can be changed based on a slimming processing time, it is possible to obtain a desired width by adjusting the processing time.

Figure 5H:
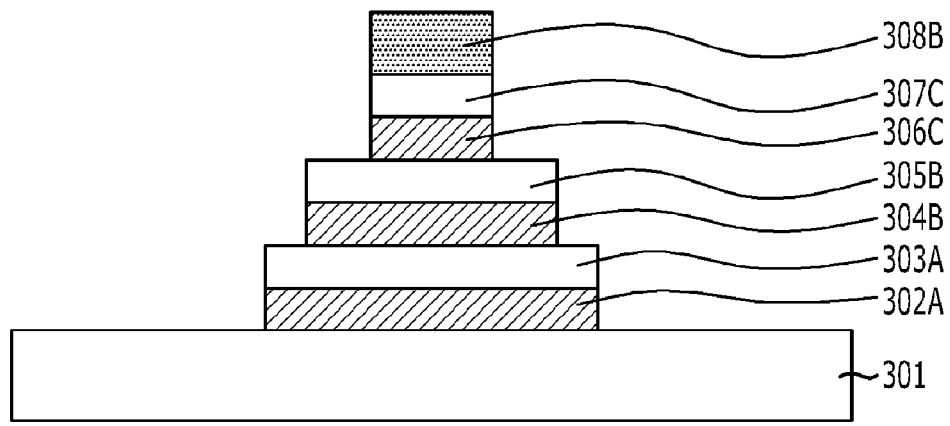

Referring to FIG. 5H, the second etched third insulation layer 307B and the second etched third conductive layer 306B are etched using the second slimmed photoresist pattern 308B as an etch barrier. Moreover, the first etched second insulation layer 305A and the first insulation layer 303 are etched at the same time when the second etched third insulation layer 307B is etched, and the first etched second conductive layer 304A and the first conductive layer 302 are etched at the same time when the second etched third conductive layer 306B is etched. That is, exposed portions of the first etched second insulation layer 305A and the first insulation layer 303 are also etched when the second etched third insulation layer 307B is etched, and exposed portions of the first etched second conductive layer 304A and the first conductive layer 302 are also etched when the second etched third conductive layer 306B is etched, since the first, second, and third insulation layers 303, 305, and 307 are formed of the same material, and the first, second, and third conductive layers 302, 304, and 306 are formed of the same material.

Particularly, the first insulation layer 303 and the first conductive layer 302 are etched to the same width as the second insulation layer 305 and the second conductive layer 304 are etched to in FIG. 5F. Similarly, the first etched second insulation layer 305A and the first etched second conductive layer 304A are etched to the same width as the first etched third insulation layer 307A and the first etched third conductive layer 206A are etched to in FIG. 5F. As a result, there is formed a structure in a step shape where widths are gradually reduced in order of a first etched first insulation layer 303A and a first etched first conductive layer 302A, a second etched second insulation layer 305B and a second etched second conductive layer 304B, and a third etched third insulation layer 307C and a third etched third conductive layer 306C.

For this purpose, it is preferable that the layers 307B, 305A, and 303 are etched with an etch gas different from that used to etch the layers 306B, 304A, and 302 as a result of considering the etch selectivity of each layer.

That is, in case the third, second, and first insulation layers 307, 305, and 303 include an oxide layer, it is preferable to etch the layers 307B, 305A, and 303 with an oxide etch gas. The oxide etch gas may include a single gas or a mixed gas selected from the group consisting of $CF_4$, $CHF_3$ and $CH_2F_2$. Furthermore, a He gas or an Ar gas may be used as an insert gas.

In case the third, second and first conductive layer 306, 304, and 302 are formed of polysilicon, it is preferable to etch the layers 306B, 304A, and 302 with a silicon etch gas. The silicon etch gas may include a single gas of HBr or $Cl_2$, or a mixed gas of HBr and $Cl_2$. Moreover, the silicon etch gas may include an $O_2$ gas.

As shown above, it is possible to form a multi-step structure having 4 or more steps by repeatedly performing the etching in FIG. 5B, the breakthrough etching in FIG. 5C, the forming of the polymer layer 309 in FIG. 5D, the slimming etching in FIG. 5E, and the etching in FIG. 5F.

Further, by implementing the method shown in FIGS. 5A to 5H, it is possible to minimize the generation of the LER of the photoresist pattern 308 when performing the slimming etching, and to uniformly maintain the width between steps by performing the breakthrough etching for removing the polymer before the slimming etching of the photoresist pattern 308.

Figure 6:
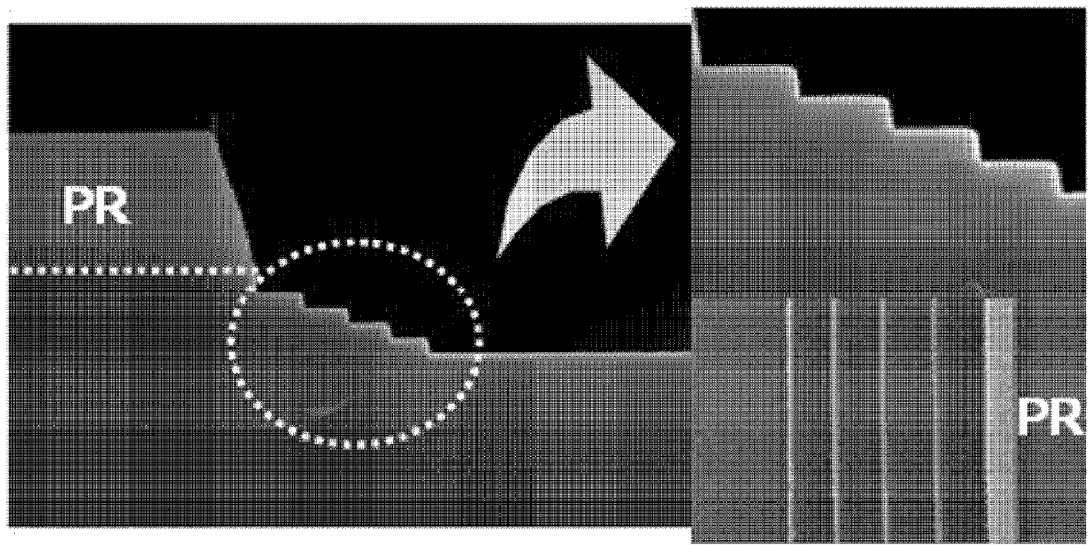
FIG. 6 is an image illustrating a shape of a pattern obtained by a method for forming a pattern of a semiconductor device in accordance with the present invention.

FIG. 6 is an image illustrating a shape of a pattern obtained by a method for forming a pattern of a semiconductor device in accordance with the present invention.

Referring to FIG. 6, it is noticed that the pattern of the semiconductor device having a step shape where a width between steps is uniform is formed without the LER when performing the breakthrough etching and the in-situ slimming etching in accordance with the embodiments of the present invention.

As described above, the embodiments of the present invention have an effect of forming a pattern to have a step structure for connecting cell strings in a 3D structure of a nonvolatile memory device.

Moreover, in accordance with the embodiments of the present invention, it is possible to form a pattern of a step structure having several steps by repeatedly performing the in-situ photoresist slimming etching and the etching in an etch chamber when performing an etching process, and performing the breakthrough etching before the slimming etching. And, there is an effect of securing the stabilization of a process by minimizing the generation of the LER.

Furthermore, in accordance with the embodiments of the present invention, it is possible to further secure an etching margin by minimizing the loss of an upper portion of a photoresist pattern when performing the slimming etching by forming a polymer layer on the photoresist pattern after the breakthrough etching and before the slimming etching.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, the method comprising:
   repeatedly stacking a stacked structure over a substrate to form a multi-stacked structure, wherein the stacked structure includes a conductive layer and an insulation layer;
   forming a photoresist pattern over the multi-stacked structure;
   first-etching an uppermost stacked structure of the multi-stacked structure using the photoresist pattern as an etch barrier;
   second-etching a resultant structure formed by the first-etching through the use of a breakthrough etching;
   slimming the photoresist pattern to form a slimmed photoresist pattern; and
   third-etching the uppermost stacked structure using the slimmed photoresist pattern as an etch barrier and, at the same time, etching a stacked structure disposed under the uppermost stacked structure and exposed by the first-etching.

2. The method of claim 1, wherein the multi-stacked structure is formed to have a step shape by the first-etching, the second-etching, the slimming, and the third-etching.

3. The method of claim 2, wherein the second-etching, the slimming, and the third-etching are performed as one unit cycle, which is repeated until the substrate is exposed.

4. The method of claim 1, wherein the first-etching and the third-etching comprises:
   etching the insulation layer; and
   etching the conductive layer.

5. The method of claim 4, wherein the insulation layer comprises an oxide layer.

6. The method of claim 4, wherein the conductive layer comprises polysilicon.

7. The method of claim 5, wherein the etching of the insulation layer uses a single or mixed gas including one or more selected from the group consisting of $CF_4$, $CHF_3$ and $CH_2F_2$ as an etch gas, and uses a He gas or an Ar gas as an insert gas.

8. The method of claim 6, wherein the etching of the conductive layer uses a single gas selected from the group consisting of HBr, $Cl_2$ and $O_2$, or a mixed gas of HBr and $Cl_2$ as an etch gas.

9. The method of claim 6, wherein the breakthrough etching uses a $CF_4$ gas or an $O_2$ gas.

10. The method of claim 9, wherein the $CF_4$ gas is supplied at a flow rate of approximately 30 sccm to approximately 150 sccm, and the $O_2$ gas is provided at a flow rate of approximately 5 sccm to approximately 200 sccm.

11. The method of claim 1, wherein the breakthrough etching is performed using a bias power in a range of approximately 0 V to approximately 50 V.

12. The method of claim 1, wherein the slimming of the photoresist pattern is performed at a pressure of approximately 20 mTorr to approximately 100 mTorr and with a source power of approximately 1,000 W to approximately 1,800 W.

13. The method of claim 1, wherein the slimming of the photoresist pattern is performed using a mixed gas of He and $O_2$, or a mixed gas of He, $O_2$ and $N_2$.

14. The method of claim 13, wherein the slimming of the photoresist pattern is performed by inserting a $CF_4$ gas to the mixed gas.

15. The method of claim 14, wherein the $CF_4$ gas is supplied at a flow rate that is in a range of approximately 3% to approximately 10% of a flow rate of the mixed gas.

16. A method for fabricating a nonvolatile memory device, the method comprising:
   repeatedly stacking a stacked structure over a substrate to form a multi-stacked structure, wherein the stacked structure includes a conductive layer and an insulation layer;
   forming a photoresist pattern over the multi-stacked structure;
   first-etching an uppermost stacked structure of the multi-stacked structure using the photoresist pattern as an etch barrier;
   second-etching a resultant structure formed by the first-etching through the use of a breakthrough etching;
   forming a polymer layer over the photoresist pattern;
   slimming the photoresist pattern on which the polymer layer is formed; and
   third-etching the uppermost stacked structure using the slimed photoresist pattern as an etch barrier and, at the same time, etching a stacked structure disposed under the uppermost stacked structure and exposed by the first-etching.

17. The method of claim 16, wherein the multi-stacked structure is formed to have a step shape by the first-etching, the second-etching, the forming of the polymer layer, the slimming, and the third-etching, wherein the second-etching, the forming of the polymer layer, the slimming, and the third-etching are performed as one unit cycle, which is repeated until the substrate is exposed.

18. The method of claim 16, wherein the forming of the polymer layer uses a CH series gas.

19. The method of claim 18, wherein the CH series gas comprises one selected from the group consisting of $CH_4$, $CH_2F_2$, $C_2H_2$, and $C_2H_4$.

20. The method of claim 16, wherein the forming of the polymer layer is performed by supplying a bias power in a range of approximately 200 W to approximately 400 W without supplying a source power.

* * * * *